United States Patent

Markow et al.

[19]

[11] Patent Number: 6,028,944
[45] Date of Patent: Feb. 22, 2000

[54] SIGNAL PROCESSING APPARATUS WITH SELECTIVE POWER AMPLIFICATION

[75] Inventors: Mitchell A. Markow, Spring; Rabah S. Hamdi, Houston, both of Tex.

[73] Assignee: Compaq Computer Corporation, Houston, Tex.

[21] Appl. No.: 08/810,431

[22] Filed: Mar. 4, 1997

[51] Int. Cl.$^7$ .................................................. H03F 21/00
[52] U.S. Cl. ............................................ 381/120; 381/107
[58] Field of Search .................................... 381/120, 107, 381/106, 98, 321, 320, 323; 330/10

[56] References Cited

U.S. PATENT DOCUMENTS

| | | |
|---|---|---|
| 5,481,616 | 1/1996 | Freadman . |
| 5,488,668 | 1/1996 | Waldhauer . |
| 5,594,386 | 1/1997 | Dhuyvetter . |
| 5,710,820 | 1/1998 | Martin et al. . |

*Primary Examiner*—Vivian Chang
*Attorney, Agent, or Firm*—Akin, Gump, Strauss, Hauer & Feld, LLP

[57] ABSTRACT

A signal processing apparatus for processing data digital signals is disclosed. The signal processing apparatus includes a high-efficiency power switching amplifier that optimizes processing during low-power applications. A signal equalizer is further coupled to the power switching amplifier and has a plurality of signal bands for defining equalization characteristic desired for the signal processing system. A gain control unit is coupled to the signal equalizer for adjusting gain of the equalized input signal handled by the signal equalizer. Lastly, a digital amplitude compressor is coupled to the gain controller and the power switching amplifier and is programmable so as to compress only those signals having an amplitude greater than a first threshold level without compressing those signals that fall below that first threshold level. Typically, low-power applications cover wattage ranging from two to seven watts of power.

27 Claims, 3 Drawing Sheets

SIGNAL PROCESSING APPARATUS WITH SELECTIVE POWER AMPLIFICATION

RELATED APPLICATIONS AND PATENTS

This application is related to co-pending application Ser. No. 08/810,430 filed [concurrently herewith] on Mar. 4, 1997, Attorney Docket No. A94004US, entitled "MULTIPLE CHANNEL SPEAKER SYSTEM FOR A PORTABLE COMPUTER," incorporated by reference herein; and U.S. Pat. No. 5,796,854 granted Aug. 18, 1998, entitled "THIN FILM SPEAKER APPARATUS FOR USE IN A THIN FILM VIDEO MONITOR DEVICE," incorporated by referenced herein and, application Ser. No. 08/811385, Attorney Docket No. COM693/4-1248, entitled "METHOD AND APPARATUS FOR PERFORMING AMPLITUDE COMPRESSION ON A DIGITAL SIGNAL," incorporated by reference herein.

THE FIELD OF THE INVENTION

The present invention relates generally to power amplifying devices for use in signal processing applications and, more specifically, to a digital power amplifier apparatus capable of performing multiple processing operations. More specifically still, the present invention is related to a low-power digital power amplifier apparatus for low-power applications having digital stereo equalization functions, as well as gain control and compression functions for processing audio sound in a low-power environment.

BRIEF DESCRIPTION OF THE RELATED ART

Power amplifying systems are well-known in the field of portable audio playback equipment. Portable audio playback equipment has limited power available when in the portable mode as the batteries have a limited power capacity. That is, light and portable devices cannot carry a sufficient number of battery cells for the power demands typically desired. One strike against portable audio equipment is that the typical power amplifiers implemented in such devices have low efficiencies ranging from an average of 20–30 percent during normal playback to as high as 50 percent at peak operating modes.

One type of portable equipment that has audio playback capabilities is a multimedia laptop computer. In such a laptop computer, there are typically two channels, each channel draws about one to two watts of power RMS. With two channels, that gives a total of four watts RMS power, which is doubled for peak output. That means that merely two speakers would require eight watts of power at peak operating conditions. If an extra pair of speakers are added, then the power requirements at peak level jump to 16 watts. The power supply via the battery cells in the laptop computer can barely supply more than eight watts. Thus, for driving the audio portion of the computer system, current technology is wholly inadequate for providing the power necessary to drive a system that most people typically find in current portable stereo systems. With the ever increasing demands for power in a laptop computer, a sound system having as many as five channels will be limited to but one watt per channel. Since the power allocated for the sound system cannot actually be increased, but is actually being decreased, a need exists to improve the efficiency of the power amplifier as well as the speakers in order to maintain the same level of quality and volume output as previously was available.

Furthermore, each stage of traditional linear signal amplification reduces the overall efficiency of the signal output. For example, in a standard analog system, a processed input signal to an output signal undergoes linear amplification that at various stages is very inefficient.

One approach to reducing the loss of efficiencies in analog linear amplification is actually to switch over from analog processing to digital processing. This occurs when the signal is processed using pulse-width modulation (PWM). During this PWM phase, the signal is in a digital representation and can be modified and manipulated without adding additional distortion that would otherwise be added during subsequent analog processing stages.

Additionally, PWM generates frequency components at the high end that radiate EMI or electromagnetic interference from the wires going to the load. The out-of-band noise must be effectively filtered out or removed in order to avoid the EMI.

One type of high-efficiency amplifier is that of a Class D amplifier. Class D-type amplifiers use switching elements that are either cut off or in saturation most of the time, allowing high efficiencies. Since the high efficiencies translate into reduced heat sinking, smaller size and light weight, they also do not suffer from crossover distortion. Unfortunately, traditional high-quality Class D amplifiers are expensive and are typically reserved for the high-end consumer market of audio components.

Because of their expense and complexity, Class D audio amplifiers have never been used in the low-power audio components, nor has a Class D audio amplifier ever been used in a laptop computer that uses a low-power circuit to drive the audio output devices, i.e., the speakers.

Thus, there is a need for a signal processing system that has increased power amplification efficiency in a low-power operating environment as well as being able to handle the complement of additional signal processing steps. Furthermore, the digital power amplifier should also be able to handle signal compression in an efficient manner that lessens the impact of distortion caused to the signal while at the same time retaining the signal in as pure a form as possible.

SUMMARY OF THE INVENTION

According to the present invention, a signal processing apparatus for processing data digital signals is disclosed. The signal processing apparatus includes a high-efficiency power switching amplifier that optimizes processing during low-power applications. A signal equalizer is further coupled to the power switching amplifier and has a plurality of signal bands for defining equalization characteristic desired for the signal processing system. A gain control unit is coupled to the signal equalizer for adjusting gain of the equalized input signal handled by the signal equalizer. Lastly, a digital amplitude compressor is coupled to the gain controller and the power switching amplifier and is programmable so as to compress only those signals having an amplitude greater than a first threshold level without compressing those signals that fall below that first threshold level. Typically, low-power applications cover wattage ranging from two to seven watts of power.

The signal processing apparatus is further modified such that the signal bands in the signal equalizer are programmable with particular equalizer coefficients to optimize the sound output desired. Further, a pulse wave modulator is included for the processing of digital signals. Also, a Class A-B low-power amplifier is provided so that low power output devices can be connected, in this example, audio headphones can be attached to the AB low-power amplifier for operations.

In a further embodiment, a second power amplifier that handles high-power performance, is added and the low-power amplifier is bypassed when the signal processing apparatus is connected to a high-power source and low-power application is not of concern during operation. This is significant in that the signal processing apparatus can be incorporated in a portable electronic device that is battery operated or be plugged in to a power outlet that provides higher power than the typical batteries found in portable applications. This digital sound processing system is found in a portable computer that includes a central processing unit, memory storage devices, video output means, and the like.

DETAILED DESCRIPTION OF THE SPECIFIC EMBODIMENTS

Figure 1:
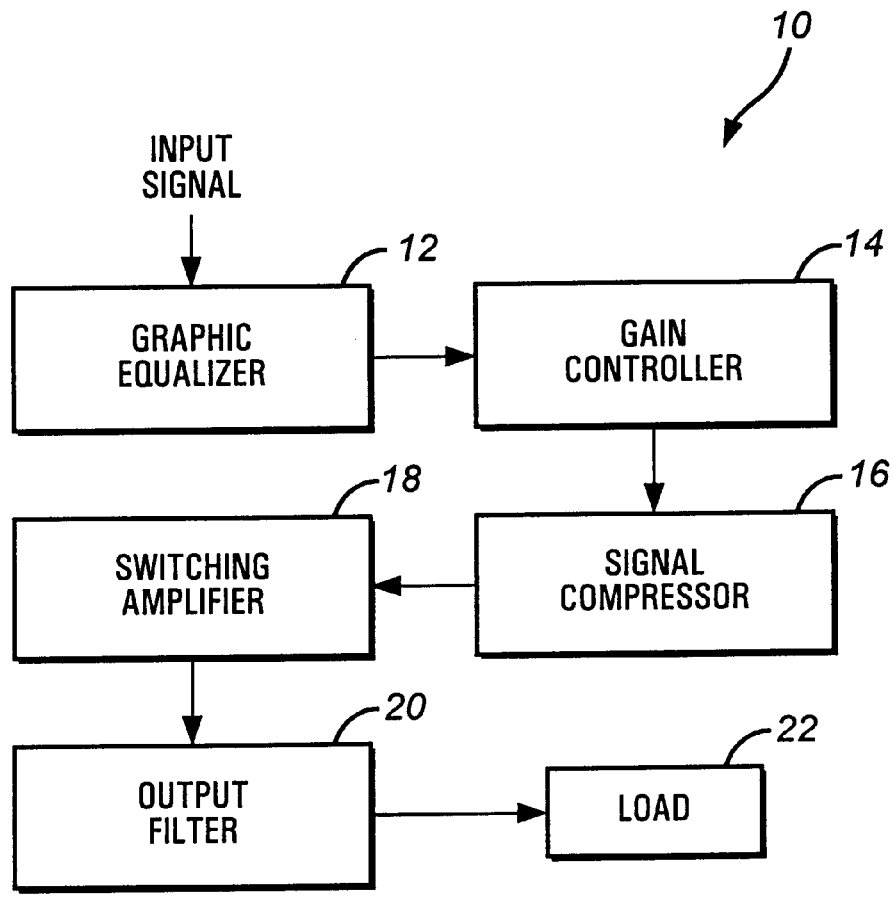
FIG. 1 depicts a block diagram of an efficient digital power amplifying system according to the present invention.

According to the block diagram of FIG. 1, a highly efficient digital power amplifier system 10 is illustrated. Within the digital power amplifier 10, there are means for providing stereo equalization in a multi-band equalizer 12, a gain control unit 14, which is further connected to signal compression unit 16, a power switching amplifier 18, and output filter 20. The final signal is then sent to load 22, which in this particular embodiment is a speaker. It will be understood by those skilled in the art that although this application is described in the embodiment of an audio sound system, other applications are possible and intended where digital signals are used.

Figure 2:
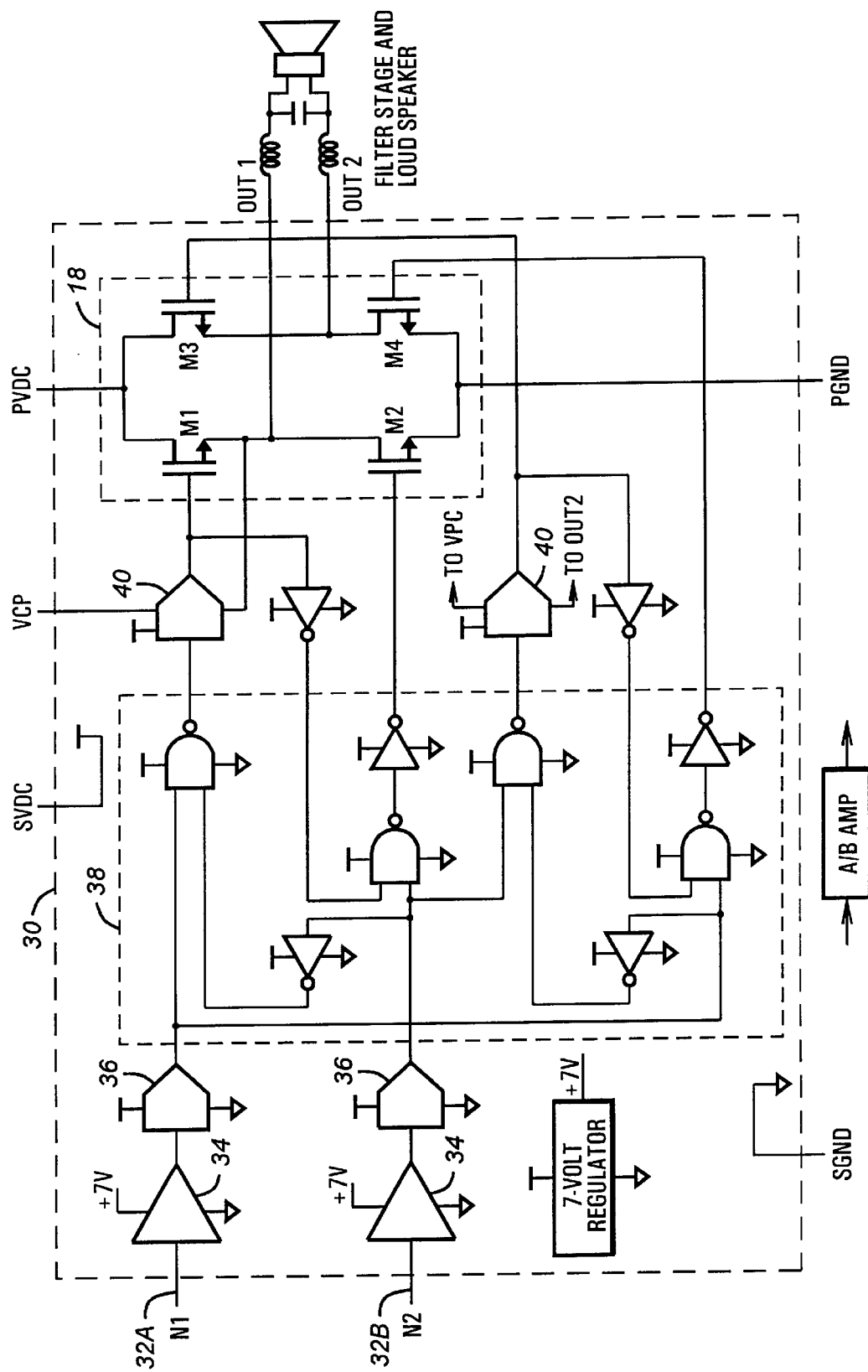
FIG. 2 illustrates in block diagram form the power switching amplifier used in the digital power amplifier of FIG. 1.

Digital power amplifier 10 uses power switching amplifier 18, which is further depicted in FIG. 2. Digital power amplifier 10 includes a Class D amplifier that converts the audio signal into high-frequency pulses that vary in width with the audio signals amplitude or uses PWM. The varying width pulses switch the power output transistors at a fixed frequency. A low-pass or output filter 20 converts the pulses back into an amplified audio signal that drives the speakers or output load 22. Low-pass filter 20 is preferably a Butterworth filter having four poles. Low-pass filter 20 is needed to remove out of band unwanted signals. This Class D audio amplifier achieves an efficiency rate of upwards of 85 to 90 percent in a low-operating power environment such as that found in a laptop computer.

Digital power amplifier 10 further includes a logic control circuit 30 and includes enhancement mode in channel power MOSFETs in full-bridge configuration. Further illustrated are inputs 32A and 32B for a first channel. In this embodiment, only a single channel is represented, but other channels may also be included. The inputs control the state of power switching bridge 18 which is a MOSFET H-bridge. Voltage shifting is included to provide adequate biasing of the high-side and low-side power MOSFET output transition power switching bridge 18. An input hysteresis block 34, which is a modified Schmitt trigger, is used preceding the PWM input signals in order to maintain stability of the input circuitry. Next, a level translation circuit 36 is introduced immediately at the output of the hysteresis block 34 to level shift from 5 volts to 12 volts necessary to power up the remainder of the logic control circuitry.

A combination of inverter and NAND-gate stages 38 are included to provide proper timing of the gate signals when switching the two power MOSFETs of the bridge 18 in order to prevent cross-conduction and shoot-through-it conditions. This is achieved by sensing the upper input gate of the high side FET and allowing sufficient time, the signal enables the low-side gate driver to bias the lower FET.

In the next stage, a level shift/gate driver 37 for both the high-side and the low-side power MOSFETs of the H-bridge 18 is provided. A charge pump power supply 40 is connected to the upper gate driver to provide sufficient gate bias voltage to the high-side LDMOS, propagation delay times are introduced to each of the gate drivers in order to provide symmetry of the output pulse while maintaining the proper "dead time" when switching between the two devices in H-bridge 18. This provides shoot-through protection. Afterwards, output channels are provided to the speaker.

Additionally, a Class A-B amplifier stage 42 is included and is separate from the main Class D amplifier circuit. The dual-channel Class A-B amplifier is used for low-power audio headphone amplification. This is an analog amplifier and has first and second inputs 44 and first and second outputs 46 per channel. This amplifier shares a common signal ground with the logic control circuitry of the Class D amplifier. Since this is for low-power audio headphone amplification, it draws a minor current or power level of less than one watt, typically about ¼ watt.

Further, two separate power supplies (not shown) are used in this circuit. This is to prevent cross-coupling between the high-current H-bridge output and the low-current control logic during normal operation. This also minimizes the total harmonic distortion (THD) in audio amplifier application. The two voltages are the signals voltage supply and the power supply and are connected separately and as far apart from each other as possible.

The battery is one source for the power supply. The battery operates as a capacitor, or pool, to cure ripple. This is accomplished with the use of voltage rails in the battery to smooth out voltage ripple. As the battery goes from 16 V to 8 V, sensors monitor the state of the battery and the battery, which is connected to the switching amplifier. The ripple needs to be smoothed, or eliminated, in order to provide a clean signal to the speakers. The sensor monitors voltage level, power demand, temperature and recharge state. These sensors are well known to those skilled in the art.

The amplifier system 10 provides for high efficiency power amplification that allows for much improved sound quality, as well as other types of signal processing. Further efficiency is obtained by digitally processing the audio input signal through the other stages, such as through the equalizer, the gain control, the compression mechanism, as well as the output filter. This greater efficiency allows for these particular elements to be integrated into a single application-specific integrated circuit (ASIC) or to be programmed optimally through the central processing unit or other stages applicable for such programming in particular environments, such as for example, a personal computer system.

In this embodiment digital power amplifier 10 is implemented in a laptop computer where limited power is available for driving the sound system. In a typical low-power application, the power band is anywhere from two watts to seven watts maximum. The average range is typically from two watts to five watts.

Output filter 20 serves to remove the high-frequency components of the PWM wave form that is outputted from digital amplifier 10. These particular frequency components radiate electromagnetic interference (EMI) from the wires going to the load 22. These signals are carefully measured once the overall system is initially built in the planning stage. Once the system is working and the measurements for spurious noise have been made, then the appropriate filter is selected to filter out the high-frequency noises interfering with the system.

Stereo equalization is performed to compensate for non-ideal characteristics and transducer excursions of the frequency spectrum by additional filtering. A multi-band stereo equalizer is provided and can have as few as three bands and more than seven bands. In this embodiment, equalizer 12 consists of five bands that are constructed with bi-quad IIR second order filters with variable gain and frequencies. Each section is utilized to provide cut or boost. This is a programmable equalizer arrangement so the equalizer coefficients are then downloadable to optimize the system according to the load being fitted with the overall circuitry.

Figure 3:
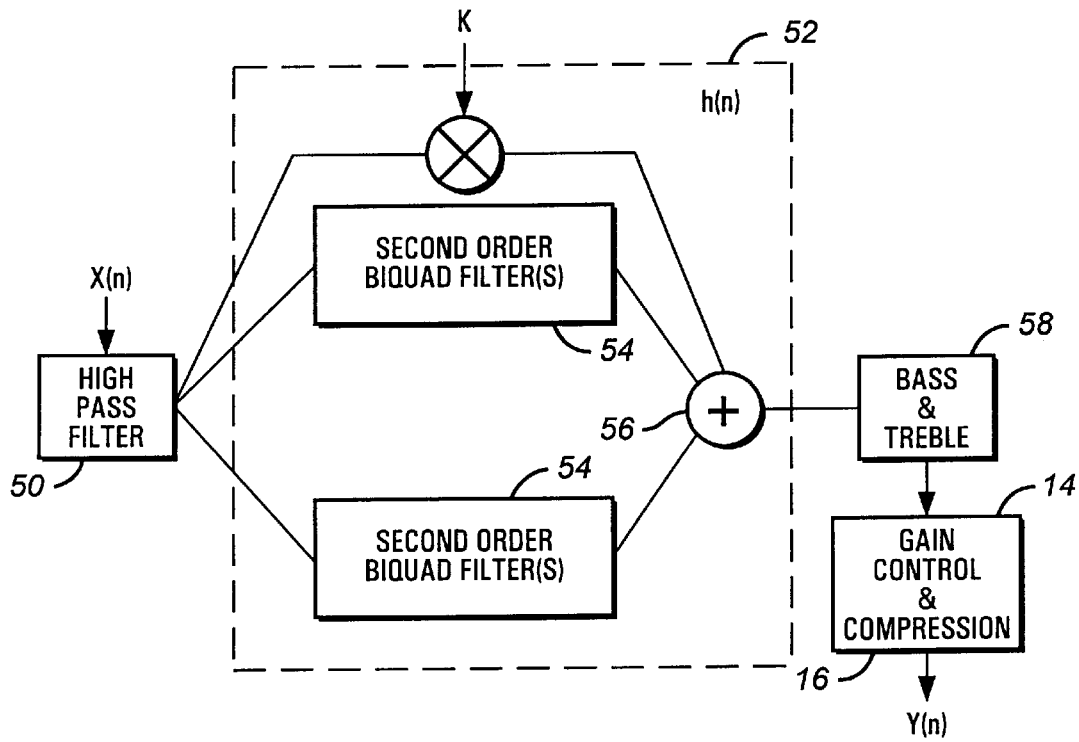
FIG. 3 is a block diagram of the programmable signal equalizer with gain control according to the present invention.

An example of equalizer 12 is depicted in FIG. 3. FIG. 3 depicts an equalizer operating on a signal for one channel. An initial signal X(n) proceeds to a high-pass filter 50 to shape the low frequency before being processed in the second order bi-quad filters shown in the block 52. Within block 52 are a plurality of second order bi-quad filters 54 that construct the multi-band equalizer 12. Finally, after being filtered, the signal is re-added at adder 56 before proceeding to base and treble control unit 58. After the base and treble have been determined, the signal then proceeds to the gain control 14 and compression unit 16. It is intended that multiple channel designs be used, especially for stereo sound. Additionally, the second order bi-quad filters 54 can be fine-tuned for acoustical characteristics and specifics for that particular channel.

Master adjustable gain control unit 14 and amplitude compressor 16 are integrated into the system 10 to achieve optimal signal levels and performance. Amplitude compressor 16 is the subject of a co-pending patent application Ser. No. 08/811,385, entitled "Method and Apparatus for Performing Amplitude Compression on Digital Signal, Enclose" (Attorney Docket No. COM693/4-1248) incorporated by reference for all purposes. The amplitude compressor 16 provides for a fast attack time constant with low transient distortions and is able to eliminate clipping without unduly limiting the input signal. The amplitude compressor 16 has programmable and downloadable compressor ratio functionality and can be either enabled or disabled according to the design specifications and sound characteristics desired in the final performance. This particular signal amplitude compressor 16 operates on samples as they become available and produces the compressed output when the signal level is above a given threshold.

It should be noted that the amplitude compressor 16 used is designed to control the output levels and limits input to the characteristics of power amplifier 10. This is described and controlled in the BIOS call to select between either portable, battery-powered operation or direct-current or wall-power operation. If the power supply is from the wall, then the signal is instituted in the BIOS call to select an optional higher powered amplifier that may be provided in the laptop computer. This allows the system to operate with a greater power band than would otherwise be possible in the lower power or portable application while merely operating on chargeable batteries. In this way, the problems inherent in the low-power amplifier are overcome, and a high-power amplifier may be implemented instead.

Figure 4:
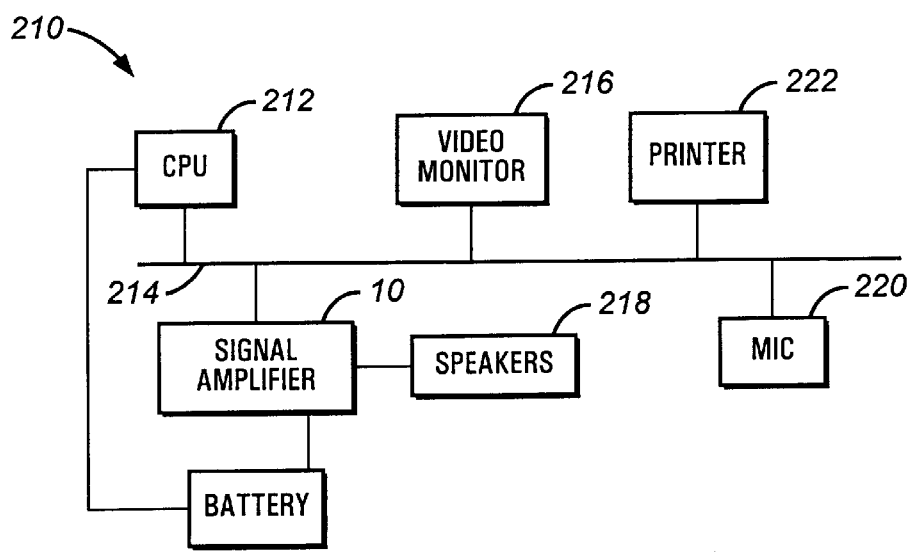
FIG. 4 is a block diagram of a basic computer system having the signal amplifier of FIG. 1 incorporated therein.

In one implementation, the signal amplifier system of FIG. 1 is used in a multimedia computer system as depicted in the block diagram of FIG. 4. In multimedia computer 210, there is a central processing unit (CPU) 212, which includes the control elements of a standard computer system as are well-known to those skilled in the art, and is coupled to system bus 214. The BIOS calls are made with CPU 212. Further, the amplifier 10 of FIG. 1 is implemented in either a discrete application specific programmable integrated circuit (ASIC) or may be implemented in a software design in the microprocessor CPU typically used in powering and driving the multimedia computer 210. The digital signal amplifier system 10 of FIG. 1 is well suited to a multimedia computer in that a computer system operates on digital information. Specifically, in the multimedia computer, there is a video output as well as an audio output portion to computer 210. The video output is provided by video monitor 216 while the audio output is provided by speakers 218. An input signal may be modified via microphone 220 or video input device 222. The video input device 222 may include video-recorded information or still images such as those scanned or operated with a digital camera. Power supply 224 is provided and operated with a power source from an electrical outlet or from rechargeable batteries, which provide a low-power operating mode.

The foregoing disclosure and description of the invention are illustrative and explanatory thereof, and various changes in the size, shape, materials, components, circuit elements, wiring connections and contacts, as well as the details of the illustrated design and construction and method of operation may be made without departing from the spirit of the invention.

What is claimed is:

1. A signal processing apparatus connected to a power source, comprising:

a low-power amplifier to operate when the signal processing apparatus is connected to a low-power source;

a signal equalizer, coupled to an input signal source, having a plurality of signal bands for defining the equalization characteristics desired for the signal processing apparatus;

a gain controller, coupled to said signal equalizer and the low-power amplifier, for adjusting gain of said equalized input signal received from said signal equalizer; and a high-power amplifier for bypassing the low-power amplifier and operating the high-power amplifier when the signal processing apparatus is connected to a high-power source.

2. The signal processing apparatus according to claim 1 wherein said low-power range is from between two to seven watts of power.

3. The signal processing apparatus according to claim 1 where said each of said signal bands in said signal equalizer is programmable with an equalizer coefficient.

4. The signal processing apparatus according to claim 1 further comprising a pulse-wave modulator, coupled to said power switching amplifier.

5. The signal processing apparatus according to claim 1 further comprising a Class A-B low power amplifier, coupled to said power switching amplifier, for connecting to a low power output device.

6. The signal processing apparatus according to claim 5 wherein said low-power output device is an audio headphone.

7. The apparatus of claim 1, wherein the low-power amplifier is a Class D power amplifier.

8. A signal processing apparatus connected to a power source, comprising:
- a low-power amplifier to operate when a portable, rechargeable power supply is selected for the signal processing apparatus;
- a signal equalizer, coupled to an input signal source, having a plurality of signal bands for defining the equalization characteristics desired for the signal processing apparatus;
- a portable, rechargeable power supply, coupled to said low-power amplifier;
- a gain controller, coupled to said signal equalizer, and the low-power amplifier for adjusting gain of said equalized input signal received from said signal equalizer; and
- a high-power amplifier for bypassing the low-power amplifier and operating the high-power amplifier when a high-power source is selected for the signal processing apparatus.

9. The signal processing apparatus according to claim 8 wherein said low-power range is from between two to seven watts of power.

10. The signal processing apparatus according to claim 8 where said each of said signal bands in said signal equalizer is programmable with an equalizer coefficient.

11. The signal processing apparatus according to claim 8 further comprising a pulse-wave modulator, coupled to said power switching amplifier.

12. The signal processing apparatus according to claim 8 further comprising a Class A-B low-power amplifier, coupled to said power switching amplifier, for connecting to a low-power output device.

13. The signal processing apparatus according to claim 12 wherein said low-power output device is an audio headphone.

14. The signal processing apparatus according to claim 8 wherein said rechargeable power supply smooths out any ripple found in said output signal.

15. The apparatus of claim 8, wherein the low-power amplifier is a Class D power amplifier.

16. A portable computer comprising:
- a central processing unit;
- a memory storage device, coupled to said central processing unit;
- video output means, coupled to said central processing unit;
- a digital sound processing system comprising;
  - a low-power amplifier to operate when the signal processing apparatus is connected to a low-power source;
  - a signal equalizer, coupled to an input signal source, having a plurality of signal bands for defining the equalization characteristics desired for the digital sound processing system;
  - a gain controller, coupled to said signal equalizer and the low-power amplifier, for adjusting gain of said equalized input signal received from said signal equalizer; and
  - a high-power amplifier for bypassing the low-power amplifier and operating the high-power amplifier when the signal processing apparatus is connected to a high-power source.

17. The portable computer according to claim 16 wherein said low-power range is from between two to seven watts of power.

18. The portable computer according to claim 16 where said each of said signal bands in said signal equalizer is programmable with an equalizer coefficient.

19. The portable computer according to claim 16 further comprising a pulse-wave modulator, coupled to said power switching amplifier.

20. The portable computer according to claim 16 further comprising a Class A-B low power amplifier, coupled to said power switching amplifier, for connecting to a low power output device.

21. The portable computer according to claim 20 wherein said low-power output device is an audio headphone.

22. The portable computer according to claim 20 further comprising a rechargeable low-power supply coupled to said central processing unit and digital sound processing system.

23. The portable computer of claim 16, wherein the low-power amplifier is a Class D power amplifier.

24. A method of signal processing using a signal processing apparatus having a low-power amplifier and a high-power amplifier, comprising the steps of:
- operating the low-power amplifier when the signal processing apparatus is connected to a low-power source; and
- operating the high-power amplifier and bypassing the low-power amplifier when the signal processing apparatus is connected to a high-power source.

25. The method of claim 24, wherein the low-power amplifier is a Class D power amplifier.

26. The method of claim 24, further comprising the step of:
- providing the signal processing apparatus in a portable computer.

27. The method of claim 24, wherein the low-power source is a battery.

* * * * *